US010685709B2

United States Patent
Tanaka et al.

(10) Patent No.: US 10,685,709 B2
(45) Date of Patent: Jun. 16, 2020

(54) NONVOLATILE SEMICONDUCTOR MEMORY WITH GATE INSULATION LAYER OF A TRANSISTOR INCLUDING FERROELECTRIC MATERIAL

(71) Applicant: TOSHIBA MEMORY CORPORATION, Tokyo (JP)

(72) Inventors: Chika Tanaka, Fujisawa Kanagawa (JP); Masumi Saitoh, Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/120,031

(22) Filed: Aug. 31, 2018

(65) Prior Publication Data
US 2019/0287617 A1 Sep. 19, 2019

(30) Foreign Application Priority Data
Mar. 16, 2018 (JP) .................................. 2018-050106

(51) Int. Cl.
*G11C 11/21* (2006.01)
*G11C 14/00* (2006.01)
*H01L 27/11502* (2017.01)

(52) U.S. Cl.
CPC .......... *G11C 14/0072* (2013.01); *G11C 11/21* (2013.01); *H01L 27/11502* (2013.01)

(58) Field of Classification Search
CPC ..... G11C 14/0072; G11C 11/21; G11C 11/22; H01L 27/11502
See application file for complete search history.

(56) References Cited

U.S. PATENT DOCUMENTS

| | | | |
|---|---|---|---|
| 6,069,816 A | 5/2000 | Nishimura | |
| 6,242,298 B1 * | 6/2001 | Kawakubo | ........ H01L 21/31691 |
| | | | 438/239 |
| 6,285,577 B1 | 9/2001 | Nakamura | |
| 8,154,916 B2 | 4/2012 | Sugiyama et al. | |
| 2001/0036101 A1 | 11/2001 | Schlosser et al. | |
| 2013/0135921 A1 | 5/2013 | Owada | |

FOREIGN PATENT DOCUMENTS

| | | |
|---|---|---|
| JP | 2004206860 A | 7/2004 |
| JP | 3698386 B2 | 9/2005 |
| JP | 5023167 B2 | 9/2012 |

* cited by examiner

*Primary Examiner* — Sultana Begum
(74) *Attorney, Agent, or Firm* — Kim & Stewart LLP

(57) ABSTRACT

A semiconductor memory includes a first and a second transistor each with one of source/drain connected to a first wiring. The other of the source/drain for each of first and second transistor is connected to the gate of the other transistor. A third and a fourth transistor each have gates connected to a second wiring, one of source/drain of each connected to a third or fifth wiring, the other of the source/drain connected to the other of the source/drain of the first or second transistor. For the third transistor, a gate insulation layer includes a first ferroelectric material. For the fourth transistor, and a gate insulation layer includes a second ferroelectric material.

6 Claims, 6 Drawing Sheets

NONVOLATILE SEMICONDUCTOR MEMORY WITH GATE INSULATION LAYER OF A TRANSISTOR INCLUDING FERROELECTRIC MATERIAL

CROSS-REFERENCE TO RELATED APPLICATION

This application is based upon and claims the benefit of priority from Japanese Patent Application No. 2018-050106, filed Mar. 16, 2018, the entire contents of which are incorporated herein by reference.

FIELD

Embodiments described herein relate generally to a nonvolatile semiconductor memory.

BACKGROUND

A static random access memory (SRAM) is a volatile-type memory and include many memory cells arranged in an array. Each memory cell includes a latch portion having four cross-coupled transistors and two selection transistors for permitting the memory cell to be selectively addressed.

A nonvolatile-type memory in which the transistors in the latch portion of the otherwise volatile SRAM design are replaced with ferroelectric field effect transistors (FeFETs) is known. However, in such a nonvolatile memory, erasing data is performed via a holding node of the memory cell and thus, erroneous writing/erasing may occur in memory cells which are not intended to be erased in the erasing process.

DETAILED DESCRIPTION

Figure 1:
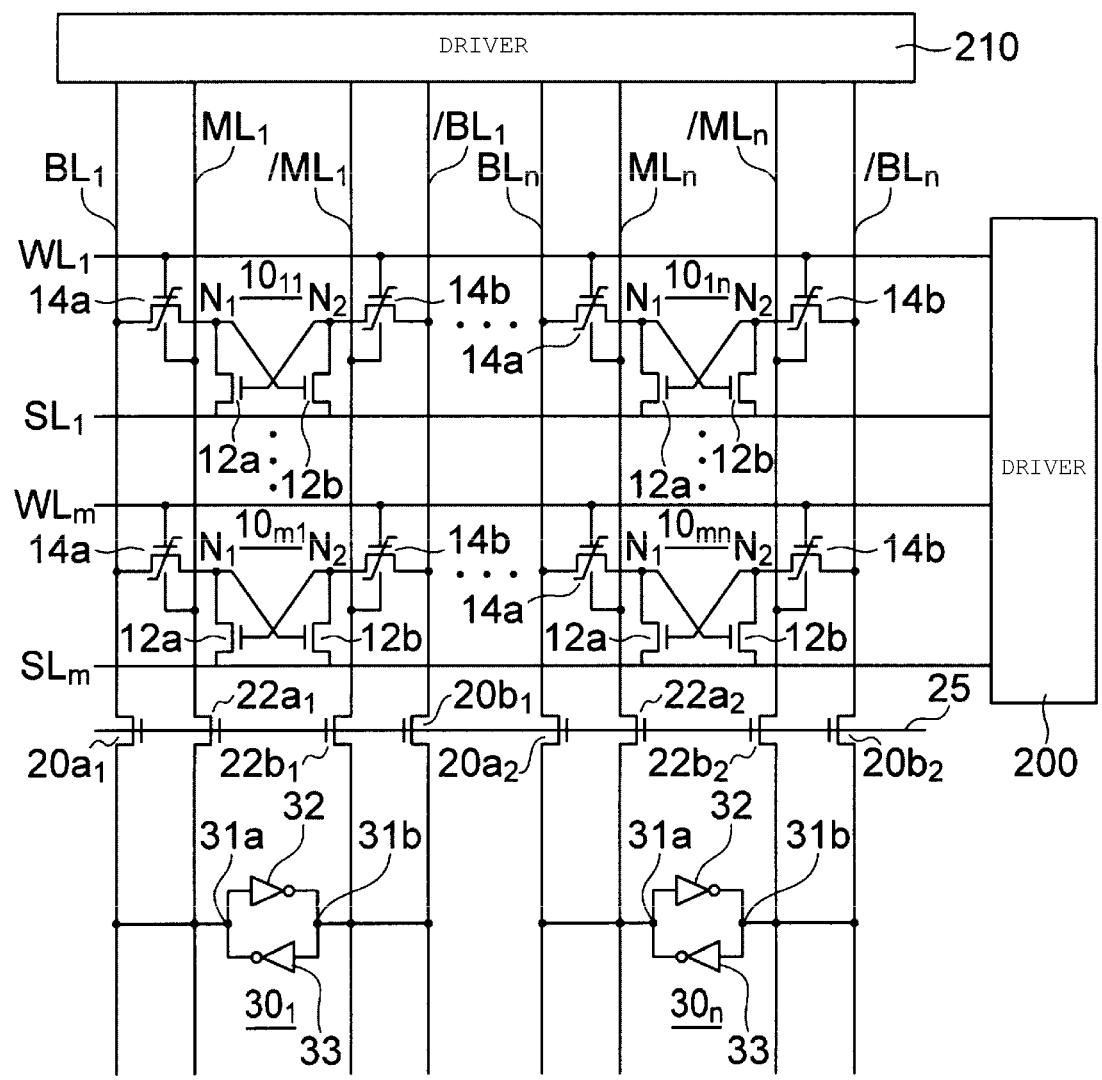
FIG. 1 is a circuit diagram illustrating a nonvolatile memory according to an embodiment.

In general, according to one embodiment, a semiconductor memory comprises a first transistor having one of a source terminal or a drain terminal electrically connected to a first wiring. A second transistor has one of a source terminal or a drain terminal electrically connected to the first wiring. The other of the source terminal or the drain terminal is electrically connected to a gate terminal of the first transistor. A gate terminal of the second transistor is electrically connected to the other of the source terminal or the drain terminal of the first transistor. A third transistor has a gate terminal electrically connected to a second wiring, one of a source terminal or a drain terminal of the third transistor is electrically connected to a third wiring. The other of the source terminal or the drain terminal of the third transistor is electrically connected to the other of the source terminal or the drain terminal of the first transistor. A body terminal of the third transistor is electrically connected to a fourth wiring. A gate insulation layer of the third transistor includes a first ferroelectric material. A fourth transistor has a gate terminal electrically connected to the second wiring. One of a source terminal or a drain terminal of the fourth transistor is electrically connected to a fifth wiring. The other of the source terminal or the drain terminal of the fourth transistor is electrically connected to the other of the source terminal or the drain terminal of the second transistor. A body terminal of the fourth transistor is electrically connected to a sixth wiring. A gate insulation layer of the fourth transistor includes a second ferroelectric material.

According to this embodiment, a nonvolatile semiconductor memory includes first to sixth wirings, a first transistor having one of a source terminal and a drain terminal electrically connected to the first wiring, a second transistor having one of a source terminal and a drain terminal electrically connected to the first wiring, the other of the source terminal and the drain terminal electrically connected to a gate terminal of the first transistor, and the gate terminal being electrically connected to the other of the source terminal and the drain terminal of the first transistor, a third transistor having a gate terminal electrically connected to the second wiring, one of a source terminal and a drain terminal of the third transistor being electrically connected to the third wiring, the other of the source terminal and the drain terminal being electrically connected to the other of the source terminal and the drain terminal of the first transistor, and a body terminal, such as a substrate terminal, is electrically connected to the fourth wiring, and a gate insulation layer includes a first ferroelectric material, and a fourth transistor having a gate terminal electrically connected to the second wiring, and a source terminal or a drain terminal of the fourth transistor being electrically connected to the fifth wiring, and the other of the source terminal and the drain terminal of the fourth transistor being electrically connected to the other of the source terminal and the drain terminal of the second wiring, and a substrate terminal is electrically connected to the sixth wiring, and a gate insulation layer includes a second ferroelectric material.

Hereinafter, example embodiments of the present disclosure will be described below with reference to the drawings.

FIG. 1 illustrates a nonvolatile semiconductor memory (which for simplicity may also referred to as a memory in some contexts) according to an embodiment. The memory includes m×n memory cells $10_{ij}$ (i=1 to m, j=1 to n) arranged in m (m≥1) rows by n (n≥1) columns, four transistors (transistors $20a_j$, $20b_j$, $22a_j$, and $22b_j$) for each column, a sense amplifier latch circuit 30 for each column, a (row) driver 200, a (column) driver 210, a word line $WL_i$ and a source line $SL_i$ for each row, and bit lines $BL_j$ and $/BL_j$ for each column and write lines $ML_j$ and $/ML_j$ for each column.

Each memory cell 10ij (i=1 to m, j=1 to n) includes two cross-coupled transistors 12a and 12b and two selection transistors 14a and 14b. The selection transistors 14a and 14b are ferroelectric transistors or the like. In each memory cell $10_{ij}$ (i=1 to m, j=1 to n), a source terminal or a drain terminal of the transistor 12a is connected to a source terminal or a drain terminal of the selection transistor 14a via a node N1, and the other of the source terminal or the drain terminal of the transistor 12a is connected to the source line $SL_i$. A source terminal or a drain terminal of the transistor 12b is connected to a source terminal or a drain terminal of the selection transistor 14b via a node N2, and the other of the source terminal or the drain terminal of the transistor 12b is connected to the source line $SL_i$.

A gate terminal of the transistor 12a is connected to the one of the source terminal and the drain terminal of the transistor 12b and the one of the source terminal and the drain terminal of the selection transistor 14b via a node N2. A gate terminal of the transistor 12b is connected to the one of the source terminal and the drain terminal of the transistor 12a and the one of the source terminal and the drain terminal of the selection transistor 14a via a node N1. In the memory cell $10_{ij}$, the other of the source terminal or the drain terminal of the selection transistor 14a is connected to the bit line $BL_j$, the gate terminal of the selection transistor 14a is connected to the word line $WL_i$, and the other of the source terminal and the drain terminal of the selection transistor 14b is connected to the bit line $/BL_j$ and the gate terminal of the selection transistor 14b is connected to the word line $WL_i$.

In the memory cell $10_{ij}$, a semiconductor layer, in which the selection transistor 14a is formed or disposed, is connected to the write line $ML_j$, and a semiconductor layer (or a well region) in which the selection transistor 14b is formed or disposed is connected to the write line $/ML_j$. In this context, a "semiconductor layer" refers to an identifiable layer formed on a semiconductor substrate, an identifiable well region formed in the semiconductor substrate, or a particular portion of the semiconductor substrate in which a transistor portion/element is formed or disposed.

Each sense amplifier latch circuit $30_j$ (j=1 to n) has a first terminal 31a, a second terminal 31b, and two cross-coupled inverters 32 and 33. An input terminal of the inverter 32 and an output terminal of the inverter 33 are connected to the first terminal 31a. An output terminal of the inverter 32 and an input terminal of the inverter 33 are connected to the second terminal 31b. The first terminal 31a of the sense amplifier latch circuit 30 disposed in the j-th column is connected to the bit line $BL_j$ and write line $ML_j$ of the corresponding j-th column and the second terminal 31b thereof is connected to the bit line $/BL_j$ and the write line $/ML_j$ of the corresponding j-th column.

The transistor $20a_j$ (j=1 to n) is disposed between the bit line $BL_j$ and the sense amplifier latch circuit $30_j$, and the transistor $22a_j$ is disposed between the write line $ML_j$ and the sense amplifier latch circuit $30_j$. The gates of the transistors $20a_j$ (j=1 to n) and the transistor $22a_j$ are both connected to the wiring 25. The transistor $20b_j$ (j=1 to n) is disposed between the bit line $/BL_j$ and the sense amplifier latch circuit 30 and the transistor $22b_j$ is disposed between the write line $/ML_j$ and the sense amplifier latch circuit $30_j$. The gates of the transistors $20b_j$ (j=1 to n) and the transistor $22b_j$ are both connected to the wiring 25.

The driver 200 is a control circuit that drives (supplies particular voltages to) the word lines $WL_i$ and $/WL_i$, the source line $SL_i$, and the wiring 25. The driver 210 is a control circuit drives (supplies particular voltages to) the bit lines $BL_j$ and $/BL_j$ and the write lines $ML_j$, and $/ML_j$. The drivers 200 and 210 may be included within a single control circuit or maybe separate components from each other.

Figure 2:
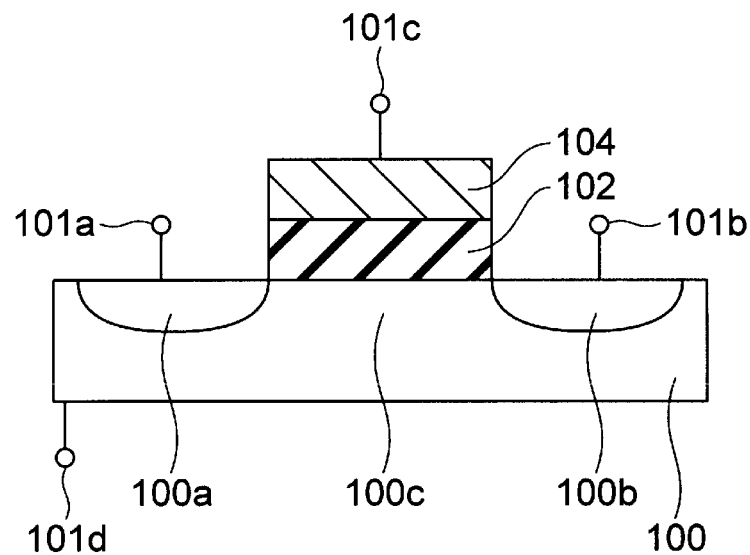
FIG. 2 is a cross-sectional diagram illustrating a ferroelectric FET used in the nonvolatile memory according to the embodiment.

As illustrated in FIG. 2, each of the selection transistors 14a and 14b, which are ferroelectric-type transistors, includes: a source region 100a and a drain region 100b that are disposed apart from each other in a semiconductor layer 100; a gate electrode 104 disposed above a region 100c of the semiconductor layer 100 which serves as a channel region between the source region 100a and the drain region 100b; and a ferroelectric layer 102 disposed between the region 100c and the gate electrode 104. A source terminal 101a is electrically connected to the source region 100a, a drain terminal 101b is electrically connected to the drain region 100b, and a gate terminal 101c is electrically connected to the gate electrode 104. The semiconductor layer 100 of the select transistor 14a is electrically connected to the corresponding write line ML, and the semiconductor layer 100 of the selection transistor 14b is electrically connected to the corresponding write line /ML. That is, a body terminal 101d of the selection transistor 14a is electrically connected to the write line ML, and the body terminal 101d of the selection transistor 14b is electrically connected to the write line /ML.

The material used to form ferroelectric layer 102 may be, for example, PLZT ((Pb, La) (Zr, Ti)$O_3$) [lead lanthanum zirconate titanate], SBT (SrBi$_2$Ta$_2$O$_9$), BLT ((Bi, Ln)$_4$Ti$_3$O$_{12}$), or a hafnium-based ferroelectric material. In the above material formulas the notation "(Pb, La)" means that it contains at least one lead (Pb) or lanthanum (La). The notation "Ln" indicates inclusion of at least one element in the lanthanide series such as lanthanum (La), neodymium (Nd), praseodymium (Pr).

Since the selection transistors 14a and 14b are ferroelectric transistors, the threshold values for each will be different depending on a polarization state of the ferroelectric layer 102. When the electric dipole moment (polarization) of the ferroelectric layer 102 is positive, that is, when a positive electric charge is generated in the vicinity of the interface between the ferroelectric layer 102 and the gate electrode 104 and a negative electric charge is generated in the vicinity of the interface between the ferroelectric layer 102 and the channel forming region 100c, the threshold value is increased, and when the electric dipole moment (polarization) of the ferroelectric layer 102 is negative, that is, when a negative electric charge is generated in the vicinity of the interface between the ferroelectric layer 102 and the gate electrode 104 and a positive electric charge is generated in the vicinity of the interface between the ferroelectric layer 102 and the channel forming region 100c, the threshold value is decreased. In the present embodiment, data held in the selection transistor is considered equal to "1" when in the electric dipole moment is positive and equal to "0" when the electric dipole moment is negative.

Operation

Next, operations of a memory according to an embodiment will be described. The operation includes certain operations in a nonvolatile mode and other operations in an SRAM mode. Operations in the nonvolatile mode include a nonvolatile write operation and a nonvolatile read operation.

The nonvolatile write operation is an operation of writing data into the selection transistors 14a and 14b, which are the nonvolatile elements of the memory cell. The nonvolatile write operation makes it possible to convert volatile data (SRAM data) into nonvolatile data. The nonvolatile read operation makes the potential levels at the nodes N1 and N2 correspond to the (nonvolatile) data held in the selection transistors 14a and 14b of the memory cell. The nonvolatile read operation is preferably performed immediately after power is applied (e.g., at startup), this is because the potentials of the nodes N1 and N2 in the memory cells are in a floating state immediately after power is applied to the memory.

The operation in the SRAM mode includes writing volatile data (SRAM data) into the nodes N1 and N2 via the drivers 200 and 210, and reading the SRAM data from the nodes N1 and N2.

Writing in SRAM Mode

Writing in SRAM mode can be performed in the same manner as in a standard volatile-type SRAM. For example, in a case of writing SRAM data into a memory cell $10_{11}$, writing data "1" into the node N1 and data "0" into the node N2, a high potential (for example, Vdd) is applied to a bit line $BL_1$, a low potential (for example, 0 V) is applied to a bit line $/BL_1$, and a potential for making the selection transistors 14a and 14b to be an ON state is applied to a word line $WL_1$. In this case, a low potential is applied to the word lines $WL_i$ for i≠1 and a low potential is applied to the bit lines $BL_j$ and $/BL_j$, for j≠1. During the write operation described above, the driver 200 applies a potential to the wiring 25 for making the transistors $20a_i$, $20b_i$, $22a_i$, and $22b_i$ be in an OFF state.

Reading in SRAM Mode

Figure 3:
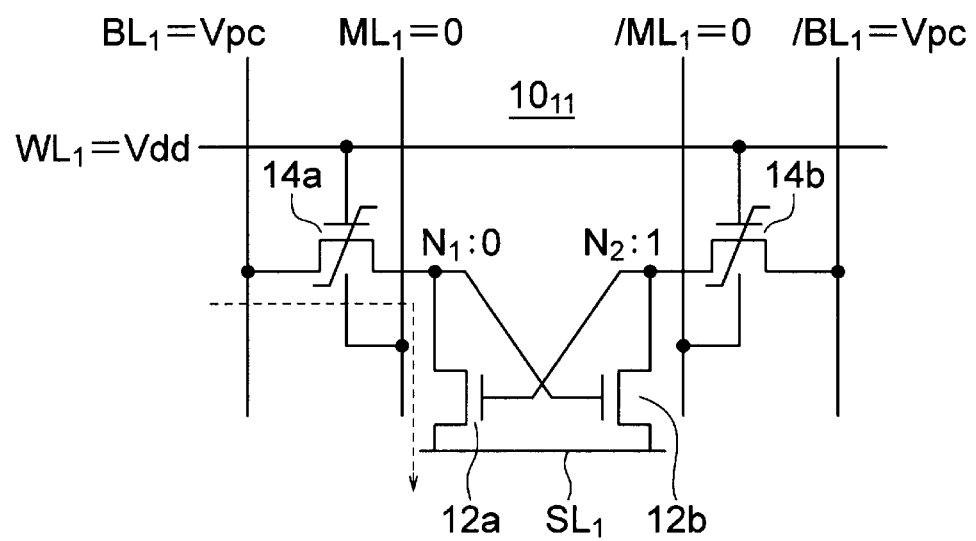
FIG. 3 is a diagram illustrating SRAM reading in the embodiment.

Regarding the reading from the SRAM, a case where SRAM data is read from a selected memory cell (memory cell $10_{11}$) will be described with reference to FIG. 3 as an example. FIG. 3 is a diagram illustrating the potentials applied to the wiring in reading SRAM data from the memory cell $10_{11}$. In the memory cell $10_{11}$, data "0" is stored in the node N1 and data "1" is stored in the node N2.

First, a potential for making all (j=1 to n) transistors $20a_j$, $20b_j$, $22a_j$, and $22b_j$ to be in the ON state is applied to the wiring 25 by the driver 200. Subsequently, a potential of 0 V is applied to write lines $ML_1$ and $/ML_1$ by the driver 210, and a power supply potential Vdd is applied to the word line $WL_1$ by the driver 200. The timing at which the power supply potential Vdd is applied to the word line $WL_1$ is preferably set at the same time as the precharge or directly after the precharge. A potential of 0 V is applied to the other wirings, the word lines $WL_i$ (i=2 to m), the (i=2 to n) bit lines $BL_j$ and $/BL_j$, the write lines $ML_j$ and $/ML_j$, and the source lines $SL_i$.

In this state, in the memory cell $10_{11}$, since the potential of the node N2 is "1" and the potential of the node N1 is "0", the transistor 12a is in the ON state and the transistor 12b is in the OFF state. At this time, a precharge potential Vpc is applied to the bit lines $BL_1$, and $/BL_1$ by the driver 210. The precharge potential Vpc is, for example, one half of the power supply potential Vdd. When the precharge potential Vpc is applied, a read current flows from the bit line $BL_1$ to the selection transistor 14a, the node N1, the transistor 12a, and the source line $SL_1$. However, since the transistor 12b is in the OFF state, no current flows from the bit line $/BL_1$ to the selection transistor 14b, the node N2, the transistor 12b, and the source line $SL_1$. Thus, even though the potential of the bit line $BL_1$ decreases, the potential of the bit line $/BL_1$ does not decrease. This state is detected, amplified, and latched by the sense amplifier latch circuit $30_1$. Data amplified and latched by the sense amplifier latch circuit $30_1$ is subsequently output to the outside.

Even when a selected memory cell is other than the memory cell $10_{11}$, the operation can be performed in substantially the same way. After performing the reading in the SRAM mode, the potential of the node N2 also decreases. That is, SRAM reading is a destructive reading. For that reason, rewriting is performed by applying the voltage Vdd to the word line $WL_1$ and making the selection transistors 14a and 14b to be in the ON state when rewriting the original data to the nodes N1 and N2. With this, data held in the sense amplifier latch portion is written to the nodes N1 and N2 via the bit lines $BL_1$ and $/BL_1$.

Nonvolatile Writing

Figure 4:
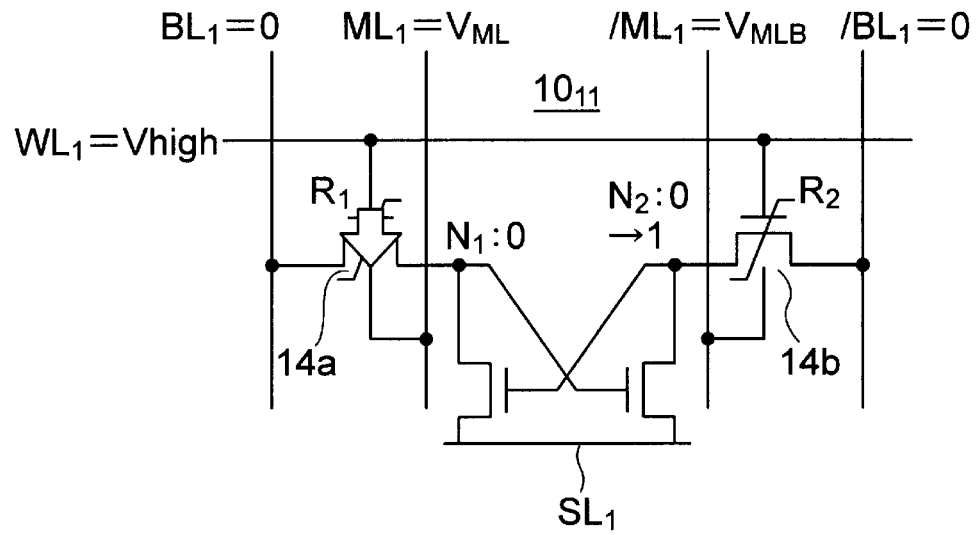
FIG. 4 is a diagram illustrating nonvolatile writing in the embodiment.

Next, a case where nonvolatile writing is performed on the selection transistor 14a of a selected memory cell, the memory cell $10_{11}$ as an example, will be described with reference to FIG. 4. Here, the nonvolatile writing is a writing in which the polarization of the ferroelectric layer of the selection transistor 14a is made to be in a negative state. It is assumed in this example that the ferroelectric layer of the selection transistor 14b is in a neutral state (that is not polarized). In this case, the potentials of the nodes N1 and N2 are set to "0" level.

First, the driver 200 applies a potential for making the (j=1 to n) transistors $20a_j$, $20b_j$, $22a_j$, $22b_j$ to be in the OFF state to the wiring 25. Subsequently, the potentials of the bit lines $BL_j$ (j=1 to n) and $/BL_j$ are set to 0 V by the driver 210. The potential of the source lines $SL_i$ (i=1 to m) is also set to 0 V by the driver 200. By the driver 200, a potential $V_{high}$ is applied to the word line $WL_1$ and a potential $V_{low}$ is applied to the non-selected word lines $WL_i$ (i≠1), and a potential $V_{ML}$ is applied to the write line $ML_1$ and a potential $V_{MLB}$ is applied to the write lines $/ML_1$, $ML_j$, $/ML_j$ (j=2 to n) by the driver 210. Here, when the coercive voltage for the dielectric layer of the selection transistor 14a is Vc, the potentials described above satisfy the following relational expressions:

$V_{high} > V_{low} > Vc$ $Vc > V_{ML} > 0$ $Vc > V_{MLB} > 0$ $V_{high} - V_{ML} > Vc$ $V_{low} - V_{MLB} < Vc$ $V_{high} - V_{MLB} < Vc$ $V_{low} - V_{ML} < Vc$ When such potentials are applied, a voltage $(V_{high} - V_{ML})$ is applied to a dielectric layer of the selection transistor 14a of the selected memory cell $10_{11}$, a voltage $(V_{high} - V_{MLB})$ is applied to a dielectric layer of the selection transistor 14b of the memory cell $10_{11}$ and the dielectric layers of the selection transistors 14a and 14b of the memory cells $10_{1j}$ (j=2 to n), and a voltage $(V_{low} - V_{MLB})$ is applied to each of the dielectric layers of the selection transistors 14a and 14b of the memory cells $10_{ij}$ (i=2 to m, j=2 to n). Accordingly, a voltage larger than the coercive voltage Vc is applied to the dielectric layer of the selection transistor 14a of the memory cell $10_{11}$. However, a voltage smaller than the coercive voltage Vc is applied to the dielectric layer of the selection transistor 14b of the selected memory cell $10_{11}$, each of the dielectric layers of the selection transistors 14a and 14b of the memory cell $10_{1j}$ (j=2 to n), and each of the dielectric layers of the selection transistors 14a and 14b of the memory cell $10_{ij}$ (i=2 to m, j=2 to n). With this, nonvolatile writing can be performed on the selection transistor 14a of the memory cell $10_{1j}$.

The potentials $V_{ML}$ and $V_{MLB}$ applied to the write lines $ML_j$ and $/ML_j$ (j=1 to n) satisfy the above relational expressions. However, when performing SRAM reading and nonvolatile writing of data when nonvolatile writing is performed after SRAM reading is performed, for example, when data held in the node N1 is "0" and data held in the node N2 is "1", nonvolatile writing can be performed by using the data held in the sense amplifier latch circuit 301. In this case, the voltages to be applied to inverters 32 and 33 of the sense amplifier latch circuit 301 are adjusted so that the potentials output from the sense amplifier latch circuit 301 to the write lines $ML_1$ and $/ML_1$ become $V_{ML}$ and $V_{MLB}$.

First, a potential for making the (j=1 to n) transistors $20a_j$, $20b_j$, $22a_j$, and $22b_j$ to be in the ON state is applied to the wiring 25 by the driver 200. Subsequently, the potentials of the (j=1 to n) bit lines $BL_j$ and $/BL_j$ are set to 0 V by the driver 210. The potential of the (i=1 to m) source lines $SL_i$ is also set to 0 V by the driver 200. The driver 210 sets potentials of the bit lines $BL_1$ and $/BL_1$ in a floating state and applies the potential $V_{high}$ to the word line $WL_1$ and applies the potential $V_{low}$ to the other word lines $WL_i$ (i=2 to m). Then, potentials of the write lines $ML_1$ and $/ML_1$ become $V_{ML}$ and $V_{MLB}$, respectively, and nonvolatile writing can be performed.

After the nonvolatile writing is performed on the memory cell $10_{11}$, an ON resistance R1 of the selection transistor 14a becomes smaller than an ON resistance R2 of the selection transistor 14b.

Nonvolatile Reading

Figure 5A:
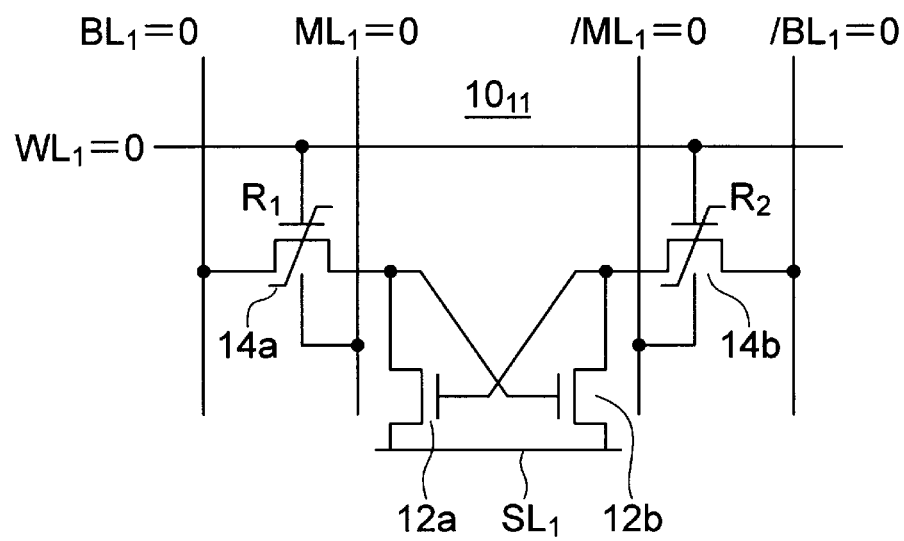
FIGS. 5A and 5B are diagrams illustrating nonvolatile reading in the embodiment.
Figure 5B:
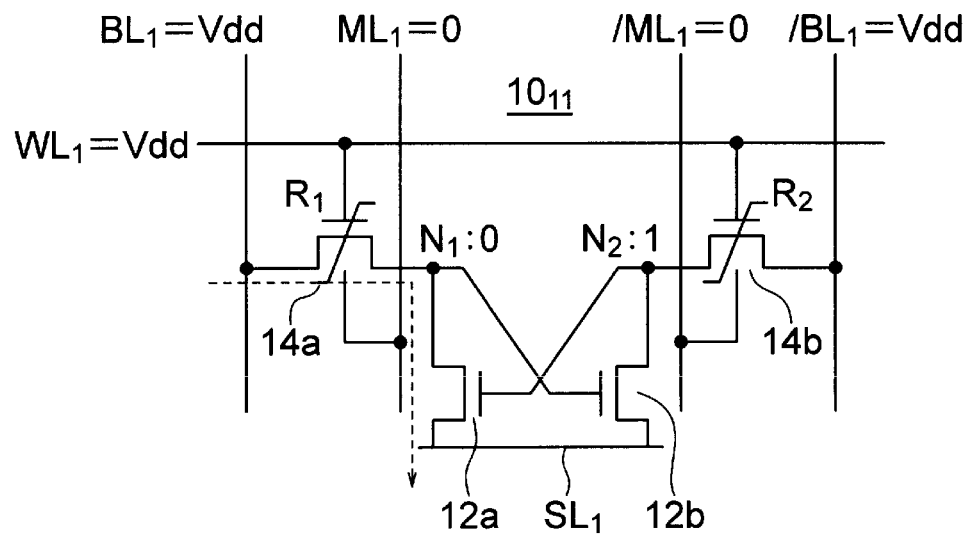

Next, regarding nonvolatile reading, a case of reading nonvolatile data from a selected memory cell, memory cell $10_{11}$, will be described with reference to FIGS. 5A and 5B. FIGS. 5A and 5B are diagrams illustrating potentials of the wirings before and after nonvolatile data is read from the memory cell $10_{11}$. In the memory cell $10_{11}$, the selection transistor 14a is polarized to a negative state, and the selection transistor 14b is not polarized for the nonvolatile data.

First, a potential for making the all (j=1 to n) transistors $20a_j$, $20b_j$, $22a_j$, and $22b_j$ to be in the OFF state is applied to the wiring 25 by the driver 200. Subsequently, the potentials of the bit lines $BL_j$ and $/BL_j$ (j=1 to n), the word lines $WL_i$ (i=1 to m), and the write lines $ML_j$ and $ML_j$ (j=1 to n) are set to 0 V (see FIG. 5A).

Thereafter, as illustrated in FIG. 5B, the potential Vdd is applied to the bit lines $BL_1$ and $/BL_1$ of the selected memory cell $10_{11}$ and the potential Vdd is applied to the word line $WL_1$. Then, the selection transistors 14a and 14b of the memory cell $10_{11}$ become the ON state. Since the ON resistance R1 of the selection transistor 14a is lower than the ON resistance R2 of the selection transistor 14b, a potential $V_{N1}$ of the node N1 becomes lower than a potential $V_{N2}$ of the node N2. With this, the transistor 12a becomes the ON state and the transistor 12b becomes the OFF state, and a nonvolatile reading current flows from the bit line $BL_1$ to the selection transistor 14a, the node N1, the transistor 12a, and the source line $SL_1$. That is, by performing the nonvolatile reading, data corresponding to data held in the selection transistors 14a and 14b of the memory cell is written into the nodes N1 and N2 of the memory cell.

Erasing of Nonvolatile Data

Figure 6:
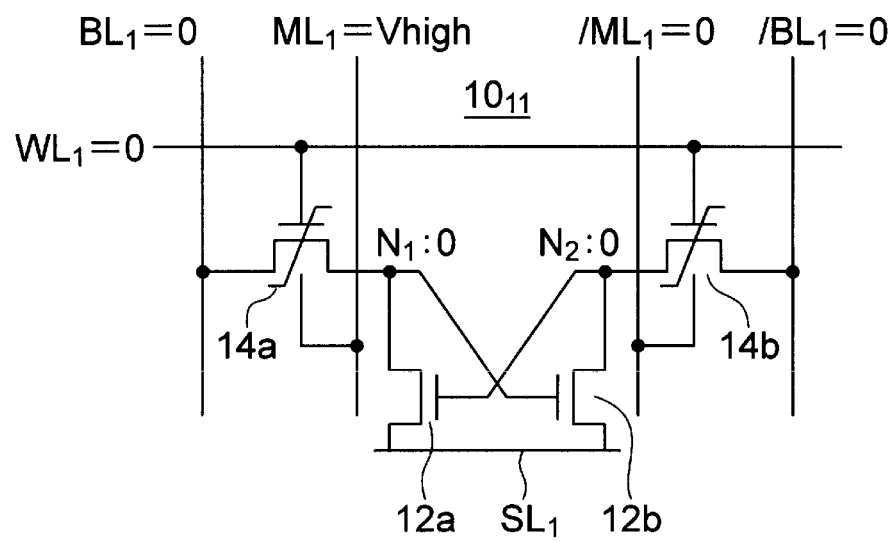
FIG. 6 is a diagram illustrating erasing of nonvolatile data in the embodiment.

Next, regarding erasing of nonvolatile data, a case where nonvolatile data is erased from the selection transistor 14a of a selected memory cell, for example, memory cell $10_{11}$ will be described with reference to FIG. 6, as an example. FIG. 6 illustrates potentials of the wirings in a case of erasing nonvolatile data from the memory cell $10_{11}$.

First, the potentials of all (j=1 to n) the bit lines $BL_j$ and $/BL_j$ and the word line $WL_1$ are set to 0 V (see FIG. 6). The potentials of the write line $/ML_1$), the non-selected (j=2 to n) write lines $ML_j$, and $/ML_j$ are set to 0 V. The potential $V_{low}$ is applied to the non-selected word line $WL_i$ (i=2 to m). Subsequently, the potential $V_{high}$ is applied to the write line $ML_1$. Then, the polarization of the dielectric layer of the selection transistor 14a of the memory cell $10_{11}$ changes from negative to positive, and erasing of nonvolatile data is performed.

Operation at Startup/Initialization

Figure 7:
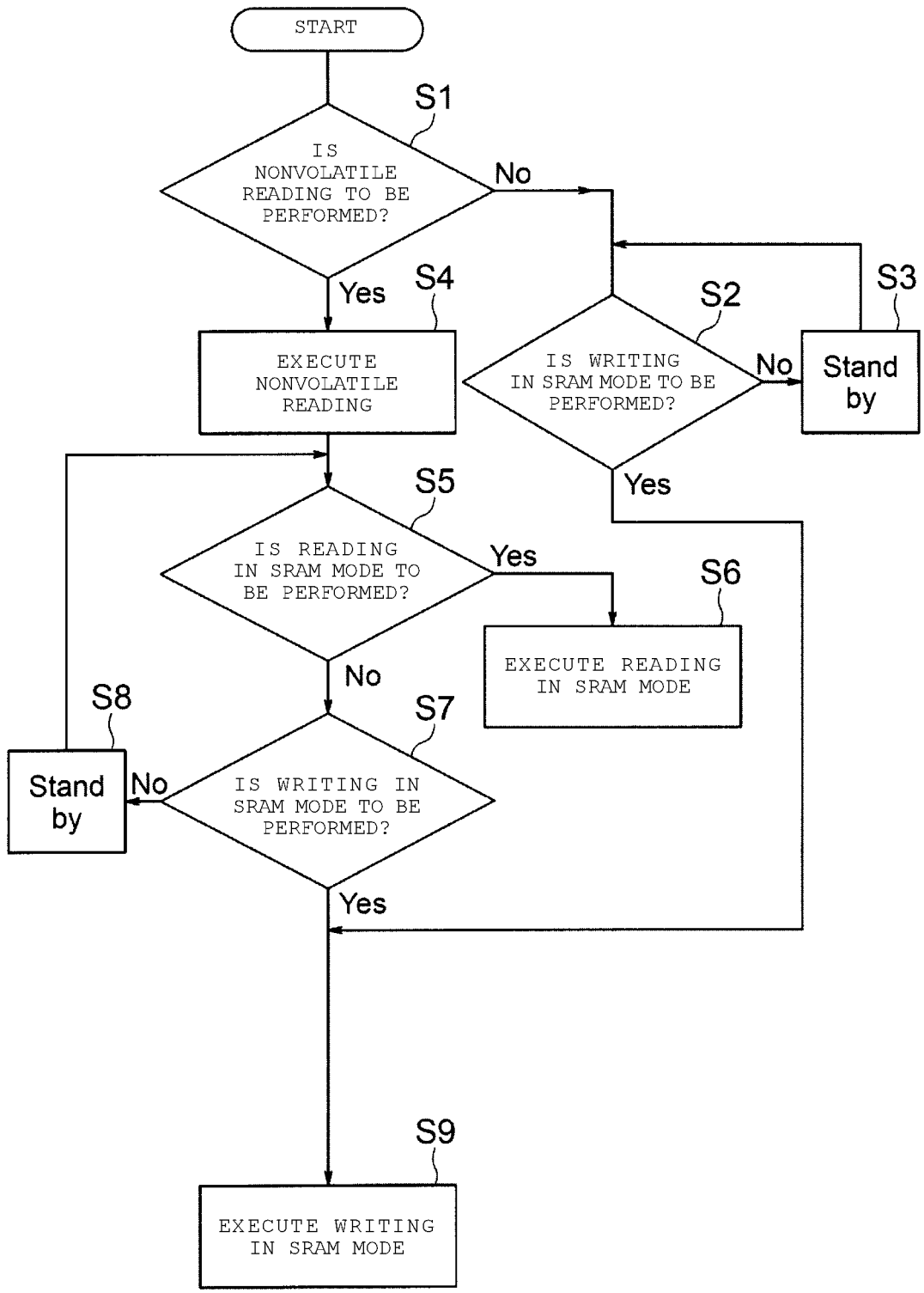
FIG. 7 is a flowchart illustrating an operation of the nonvolatile memory according to one embodiment when power is applied.

Next, operation at startup/initialization (e.g., when power is initially applied) of a nonvolatile SRAM will be described with reference to the flowchart illustrated in FIG. 7.

First, when power is applied, it is determined whether or not nonvolatile data held before shut down is to be used (considered still valid). This determination is made based on whether or not nonvolatile reading is to be performed (S1). In a case where it is determined, in Step S1, that nonvolatile reading is not to be performed, the process of FIG. 7 proceeds to Step S2 and it is determined whether or not writing in the SRAM mode is to be performed. In a case where it is determined that writing in the SRAM mode is not to be performed, the process enters a standby state (S3). Thereafter, if an instruction is issued, the process returns to Step S2. In a case where it is determined that writing in the SRAM mode is to be performed, the process proceeds to Step S9 where writing in the SRAM mode is performed. In a case where it is determined in Step S1 that nonvolatile reading is to be performed, the process proceeds to Step S4 and nonvolatile reading is performed.

Subsequently, in Step S5, it is determined whether or not reading in the SRAM mode is to be performed. In a case where it is determined that reading is to be performed in the SRAM mode, the process proceeds to Step S6 and reading in the SRAM mode is performed. In a case where it is determined that reading in the SRAM mode is not to be performed, the process proceeds to Step S7 and it is determined whether or not writing in the SRAM mode is to be performed.

In a case where it is determined in Step S7 that writing in the SRAM mode is not to be performed, the process proceeds to Step S8 and enters the standby state. Thereafter, in a case where an instruction is issued, the process returns to Step S5. In a case where it is determined in Step S7 that writing in the SRAM mode is to be performed, the process proceeds to Step S9 and writing in the SRAM mode is performed.

Operation at Shut Down

Figure 8:
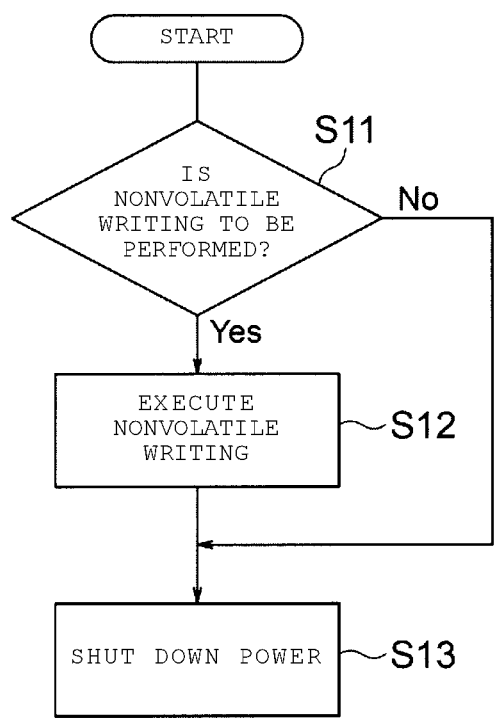
FIG. 8 is a flowchart illustrating an operation of a nonvolatile memory according to one embodiment when power is shut down.

Next, the operation in the case where power is shut down will be described with reference to the flowchart illustrated in FIG. 8.

First, in a case where an instruction to shut down power is received, it is determined whether or not nonvolatile writing is to be performed (S11). The nonvolatile writing is used for holding/storing the current SRAM data in a nonvolatile manner as nonvolatile data. In a case where it is determined that nonvolatile writing is not to be performed, a process of FIG. 8 proceeds to Step S13, and power is shut down. In a case where it is determined that nonvolatile writing is to be performed, the process proceeds to Step S12, and a nonvolatile writing is executed. Thereafter, the process proceeds to Step S13 and power is shut down. Although an example in which the nonvolatile write operation is particularly executed before power is shut down is described, the holding of nonvolatile data may be performed at other times regardless of whether or not power is being shut down, for example, at various times when considered necessary during a system operation.

As such, in the nonvolatile SRAM, by also holding data as nonvolatile data, power for the nonvolatile SRAM can be shut down when there is no memory accessing being performed over some amount of time, so that it is possible to reduce standby power as compared with a general SRAM.

As described above, according to the embodiment, it is possible to provide a nonvolatile semiconductor memory in which erroneous writing can be prevented.

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A semiconductor memory, comprising:
a first transistor having a first end connected to a first wiring;
a second transistor having a first end connected to the first wiring and a second end connected to a gate terminal of the first transistor, a gate terminal of the second transistor being electrically connected to a second end of the first transistor;
a third transistor having a gate terminal electrically connected to a second wiring, a first end of the third transistor being electrically connected to a third wiring, a second end of the third transistor being electrically connected to the second end of the first transistor, and a body terminal of the third transistor being electrically connected to a fourth wiring, and a gate insulation layer of the third transistor includes a first ferroelectric material;
a fourth transistor having a gate terminal electrically connected to the second wiring, a first end of the fourth transistor being electrically connected to a fifth wiring, a second end of the fourth transistor being electrically connected to the second end of the second transistor, and a body terminal of the fourth transistor being electrically connected to a sixth wiring, and a gate insulation layer of the fourth transistor includes a second ferroelectric material;
a sense amplifier latch circuit having a first terminal electrically connected to the third wiring and the fourth wiring and a second terminal electrically connected to the fifth wiring and the sixth wiring;
a fifth transistor between the third wiring and the first terminal of the sense amplifier latch circuit;
a sixth transistor between the fourth wiring and the first terminal of the sense amplifier latch circuit;
a seventh transistor between the fifth wiring and the second terminal of the sense amplifier latch circuit;
an eighth transistor between the sixth wiring and the second terminal of the sense amplifier latch circuit; and
a seventh wiring electrically connected to the gate terminals of the fifth, sixth, seventh, and eighth transistors.

2. A semiconductor memory, comprising:
a first transistor having a first end connected to a first wiring;
a second transistor having a first end connected to the first wiring and a second end connected to a gate terminal of the first transistor, a gate terminal of the second transistor being electrically connected to a second end of the first transistor;
a third transistor having a gate terminal electrically connected to a second wiring, a first end of the third transistor being electrically connected to a third wiring, a second end of the third transistor being electrically connected to the second end of the first transistor, and a body terminal of the third transistor being electrically connected to a fourth wiring, and a gate insulation layer of the third transistor includes a first ferroelectric material;
a fourth transistor having a gate terminal electrically connected to the second wiring, a first end of the fourth transistor being electrically connected to a fifth wiring, a second end of the fourth transistor being electrically connected to the second end of the second transistor, and a body terminal of the fourth transistor being electrically connected to a sixth wiring, and a gate insulation layer of the fourth transistor includes a second ferroelectric material; and
a control circuit connected to the first to sixth wirings and configured to selectively apply voltages to the first to sixth wirings, wherein
the control circuit is configured to:
apply a precharge voltage to the third wiring and the fifth wiring,
apply a voltage to the second wiring at a level at which the third transistor and the fourth transistor become an ON state,
read data from the third and fourth transistors, and
cause the sense amplifier latch circuit to latch the data read from the third and fourth transistors, and
after reading of the data, a voltage held at the first terminal of the sense amplifier latch circuit is lower than the coercive voltage of the first ferroelectric material and a voltage held at the second terminal is lower than the coercive voltage of the second ferroelectric material.

3. A semiconductor memory, comprising:
a first transistor having a first end connected to a first wiring;
a second transistor having a first end connected to the first wiring and a second end connected to a gate terminal of the first transistor, a gate terminal of the second transistor being electrically connected to a second end of the first transistor;
a third transistor having a gate terminal electrically connected to a second wiring, a first end of the third transistor being electrically connected to a third wiring, a second end of the third transistor being electrically connected to the second end of the first transistor, and a body terminal of the third transistor being electrically connected to a fourth wiring, and a gate insulation layer of the third transistor includes a first ferroelectric material;
a fourth transistor having a gate terminal electrically connected to the second wiring, a first end of the fourth transistor being electrically connected to a fifth wiring, a second end of the fourth transistor being electrically connected to the second end of the second transistor, and a body terminal of the fourth transistor being electrically connected to a sixth wiring, and a gate insulation layer of the fourth transistor includes a second ferroelectric material; and
a control circuit connected to the first to sixth wirings and configured to selectively apply voltages to the first to sixth wirings, wherein
the control circuit is configured to:
apply a precharge voltage to the third wiring and the fifth wiring, apply a voltage to the second wiring at a level at which the third transistor and the fourth transistor become an ON state, read data from the third and fourth transistors, and cause the sense amplifier latch circuit to latch the data read from the third and fourth transistors, and the control circuit is further configured to apply a first voltage to the second wiring and performs an erasing of data in one of the third transistor or the fourth transistor using the first voltage, a voltage supplied from the first terminal of the sense amplifier latch circuit through the fourth wiring, and a voltage supplied from the second terminal of the sense amplifier latch circuit through the sixth wiring.

4. A semiconductor memory, comprising:

a first transistor having a first end connected to a first wiring;

a second transistor having a first end connected to the first wiring and a second end connected to a gate terminal of the first transistor, a gate terminal of the second transistor being electrically connected to a second end of the first transistor;

a third transistor having a gate terminal electrically connected to a second wiring, a first end of the third transistor being electrically connected to a third wiring, a second end of the third transistor being electrically connected to the second end of the first transistor, and a body terminal of the third transistor being electrically connected to a fourth wiring, and a gate insulation layer of the third transistor includes a first ferroelectric material;

a fourth transistor having a gate terminal electrically connected to the second wiring, a first end of the fourth transistor being electrically connected to a fifth wiring, a second end of the fourth transistor being electrically connected to the second end of the second transistor, and a body terminal of the fourth transistor being electrically connected to a sixth wiring, and a gate insulation layer of the fourth transistor includes a second ferroelectric material; and a control circuit connected to the first to sixth wirings and configured to selectively apply voltages to the first to sixth wirings, wherein the control circuit is configured to apply a first voltage, which is higher than the coercive voltage of each of the first ferroelectric material and second ferroelectric material, to the second wiring and perform a writing of data into one of the third transistor or the fourth transistor using the first voltage, a voltage supplied from the first terminal of the sense amplifier latch circuit through the fourth wiring, and a voltage supplied from the second terminal of the sense amplifier latch circuit through the sixth wiring.

5. A semiconductor memory, comprising:

a first transistor having a first end connected to a first wiring;

a second transistor having a first end connected to the first wiring and a second end connected to a gate terminal of the first transistor, a gate terminal of the second transistor being electrically connected to a second end of the first transistor;

a third transistor having a gate terminal electrically connected to a second wiring, a first end of the third transistor being electrically connected to a third wiring, a second end of the third transistor being electrically connected to the second end of the first transistor, and a body terminal of the third transistor being electrically connected to a fourth wiring, and a gate insulation layer of the third transistor includes a first ferroelectric material;

a fourth transistor having a gate terminal electrically connected to the second wiring, a first end of the fourth transistor being electrically connected to a fifth wiring, a second end of the fourth transistor being electrically connected to the second end of the second transistor, and a body terminal of the fourth transistor being electrically connected to a sixth wiring, and a gate insulation layer of the fourth transistor includes a second ferroelectric material; and a control circuit connected to the first to sixth wirings and configured to selectively apply voltages to the first to sixth wirings, wherein the control circuit is configured to apply:

a first voltage to the second wiring, a second voltage, which is lower than the first voltage and has a difference from the first voltage that is greater than a coercive voltage for the first ferroelectric material, to the fourth wiring, a third voltage, which is lower than the first voltage and has a difference from the first voltage that is less than a coercive voltage of the second ferroelectric material, to the sixth wiring, and write data into the third transistor as nonvolatile data.

6. The semiconductor memory according to claim 4, wherein the control circuit is configured to:

apply a precharge voltage to the third wiring and the fifth wiring, apply a voltage to the second wiring at a level at which the third transistor and the fourth transistor become an ON state, read data from the third and fourth transistors, and cause the sense amplifier latch circuit to latch the data read from the third and fourth transistors.

* * * * *